United States Patent
Ginetti et al.

(10) Patent No.: US 9,830,417 B1
(45) Date of Patent: Nov. 28, 2017

(54) METHODS AND SYSTEMS FOR GENERATION AND EDITING OF PARAMETERIZED FIGURE GROUP

(71) Applicant: CADENCE DESIGN SYSTEMS, INC., San Jose, CA (US)

(72) Inventors: Arnold Ginetti, Antibes (FR); Jean-Noel Pic, Valbonne (FR); Alexander B Wong, Philadelphia, PA (US); Devendra Deshpande, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/204,776

(22) Filed: Jul. 7, 2016

(51) Int. Cl.
  *G06F 17/50* (2006.01)
  *G06F 3/0481* (2013.01)
  *G06F 17/30* (2006.01)

(52) U.S. Cl.
  CPC ........ *G06F 17/5072* (2013.01); *G06F 3/0481* (2013.01); *G06F 17/30312* (2013.01); *G06F 17/30345* (2013.01); *G06F 17/30557* (2013.01)

(58) Field of Classification Search
  CPC .................. G06F 17/5045; G06F 17/5081
  USPC ................................................ 716/102, 119
  See application file for complete search history.

(56) References Cited

U.S. PATENT DOCUMENTS

| | | | | |
|---|---|---|---|---|
| 5,920,486 A | * | 7/1999 | Beahm et al. | G06F 17/5068 257/E27.062 |
| 5,978,850 A | * | 11/1999 | Ramachandran et al. | G06F 9/4411 709/223 |
| 7,293,247 B1 | * | 11/2007 | Newton et al. | G06F 17/5068 703/14 |
| 8,510,145 B2 | * | 8/2013 | Rowland | G06Q 10/06311 705/26.1 |
| 8,527,934 B2 | * | 9/2013 | Ginetti et al. | G06F 17/5068 716/104 |
| 9,122,834 B1 | * | 9/2015 | Caluya et al. | G06F 17/5081 |
| 2005/0193334 A1 | * | 9/2005 | Ohashi et al. | G06F 17/248 715/246 |
| 2008/0172348 A1 | * | 7/2008 | Tien | G06Q 10/04 706/12 |
| 2009/0144620 A1 | * | 6/2009 | Bauchot et al. | G06F 17/2288 715/277 |
| 2010/0287519 A1 | * | 11/2010 | Su | G06F 17/5072 716/122 |

(Continued)

*Primary Examiner* — Sun Lin
(74) *Attorney, Agent, or Firm* — Eric L. Sophir; Dentons US LLP

(57) ABSTRACT

An electronic circuit design system for generating a programmable set of figures of an electronic circuit layout is provided. The system includes a non-transitory machine-readable layout database storing an electronic circuit layout of an electronic circuit design. The system further includes a circuit designer interface for viewing representations of the electronic circuit layout on a display unit and receiving inputs by one or more electronic circuit designers. The system further includes a processor configured to generate a figure group in the electronic circuit layout of the electronic circuit design; generate one or more templates comprising one or more parameters and a programming language code; and generate a parameterized figure group by associating the one or more templates to the figure group.

19 Claims, 10 Drawing Sheets

(56) References Cited

U.S. PATENT DOCUMENTS

2013/0111418 A1* 5/2013 Chen et al. ......... G06F 17/5081
716/52

* cited by examiner

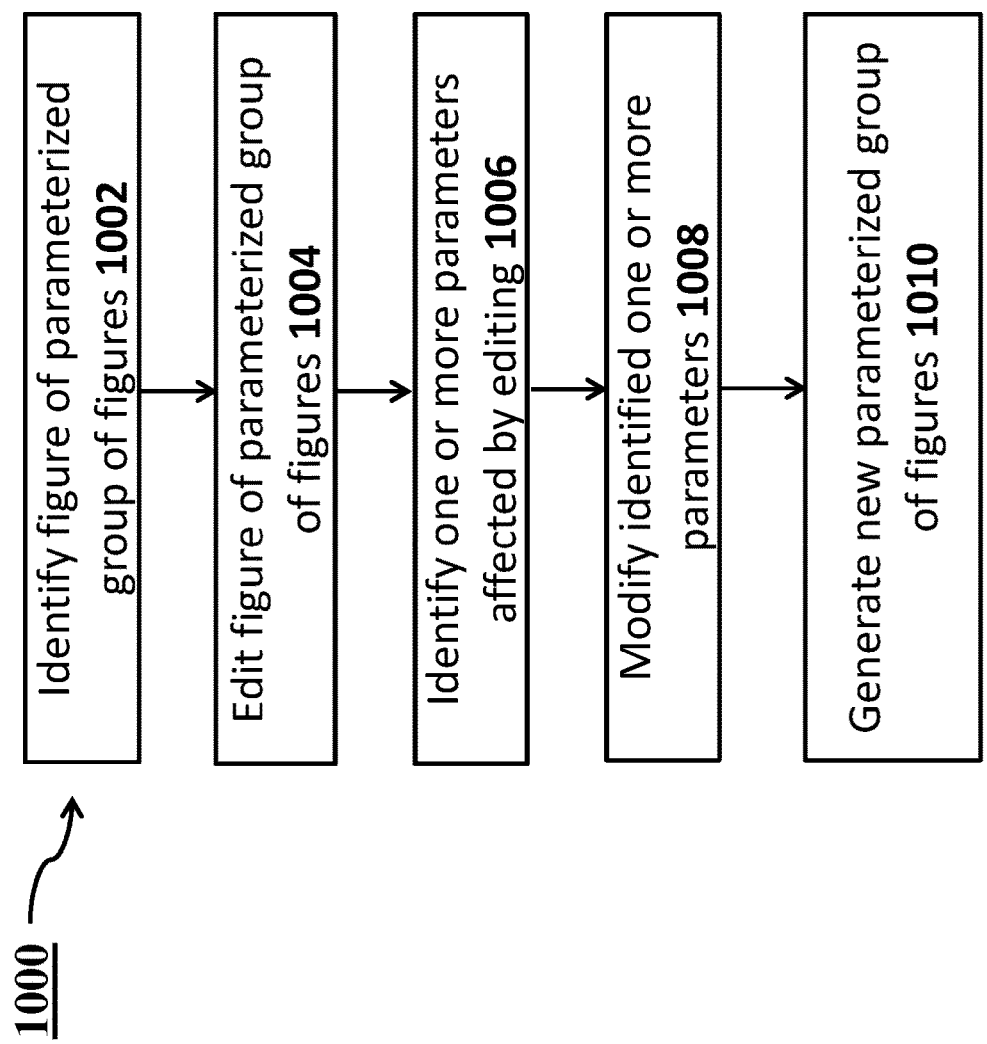

METHODS AND SYSTEMS FOR GENERATION AND EDITING OF PARAMETERIZED FIGURE GROUP

TECHNICAL FIELD

This application relates generally to the field of an electronic circuit design, and more specifically methods and systems for generating and editing of parameterized figure group represented within the electronic circuit design.

BACKGROUND

Integrated circuits or chips are used in most products that have electronic components. A typical integrated circuit (IC) design is initially conceived and tested schematically by a circuit designer, with a number of components and devices connected to generate a circuit with desired performance and characteristics. Once the circuit has been designed, it must be reconfigured from the schematic format into a geometric layout format specifying a suitable semiconductor implementation of the circuit.

A large number of components in the IC may be facilitated with an Electronic Design Automation (EDA) tool that allows the circuit designer to position and connect various shapes on the IC. The circuit designer create a custom design of such ICs, printed-circuit boards, and other electronic circuits containing the physical locations and dimensions of the circuit's components, interconnections, and various layers from the original design that may then be fabricated using EDA technologies that typically run on an operating system in conjunction with a processor-based computer system.

A geometric layout of the IC design schematic and database of records are generated to visually and logically specify the components included in the semiconductor device layout for the IC design. The configuring of the electronic circuit to a geometric layout is typically a very complicated task, and is governed by a large number of geometric rules. The geometric layout of the semiconductor device may contain geometric features such as polygons to indicate the proper size, shape, location and separation of a certain physical feature of the electronic circuit, distinguishing it from other physical features, or to indicate proper isolation and separation among the circuit elements. The geometric layout of a typical semiconductor device contains multiple figures and layers, and one or more figures are grouped to form a figure group.

Currently, the process of generating the figures describing the features of electronic components for the design of the IC separately and manually is a tedious task and is prone to error; particularly where multiple devices of an IC are grouped together into a single, high-level device to be manipulated by the designer as a single grouping or structural component of the IC. What is needed are systems and methods of circuit design that facilitate automatic generation of figures on a graphical user interface (GUI) and the underlying data describing the features of electronic components for the design of the IC, such that several components of the IC design may be logically grouped and manipulated through, both, the GUI design interface and the database storing the data associated with each of the components displayed on the GUI design interface.

SUMMARY

Methods and systems disclosed herein attempt to address the above issues and may provide a number of other benefits as well. Methods and systems of an electronic circuit design system described herein provide for generation of parameterized or programmable figure groups that describe grouped features of a design of the electronic circuit, and allow for editing of the parameterized figure group represented within the electronic circuit design. A design GUI may display objects of a parameterized figure group that may appear in various shapes, such as a rectangle, a polygon, a path, a path segment, a text, a polygon text, a scalar instance, an array instance, a path segment, an ellipse, and a donut, among others. The shapes may be displayed based on the types of components that are grouped into a particular parameterized figure group. The parameterized figure group is associated with a program (e.g., programmatic code, software application, executable script), a set of parameters, and values for those parameters. The content stored in a database record, in a design element database, of a particular parameterized figure group results from evaluating or otherwise executing the program against specified values for the parameters. Accordingly, the parameterized figure group may be instantiated as one of the design elements of an electronic circuit layout, and may likewise be displayed on a corresponding circuit design graphical user interface (GUI). The set of parameters may include design rules and modifiable design constraints. The set of design rules may include rules such as width, height, spacing between two adjacent intra-layer figures, and overlap between two inter-layer figures. The set of design constraints may include rules, such as the width and length of a gate of an IC component, such as a Metal-Oxide Semiconductor (MOS) device, and a set of circuit designer constraints, such as a die aspect ratio.

In an embodiment, computer-implemented method comprises generating, by a computer, a graphical user interface (GUI) representing a plurality of design elements of an electronic circuit layout, in accordance with one or more attributes of each respective design element stored in a plurality of records of the design elements in database; generating, by the computer, in a database configured to store a plurality of records of design elements of an electronic circuit layout, a record of a figure group based upon one or more records of one or more devices in response to receiving an instruction to generate the figure group via the GUI, the record of the figure group configured to store one or more attributes in data fields configurable via the GUI; and generating, by the computer, in the database a record of a template for the figure group, the template comprising one or more parameters corresponding to the one or more attributes in the data fields of the record of the fig group.

In another embodiment, a circuit design system comprises a layout database hosted on one or more computing devices comprising non-transitory machine-readable memory, the layout database configured to store one or more records of one or more features of an electronic circuit layout of an electronic circuit design; a client device configured to execute a circuit design interface configured to display representations of the features of the electronic circuit layout, and to receive inputs from one or more input devices; and a design server in communication with the client device and the layout database, and comprising a processor configured to generate a record of a figure group in the electronic circuit layout of an electronic circuit; generate one or more templates of features comprising one or more parameters and a programming language code; and generate a record of a parameterized figure group containing data associating the one or more templates to the figure group.

In another embodiment, a computer-implemented method comprises generating, by a computer, a figure of a first parameterized figure group according to one or more inputs received via a graphical user interface (GUI) configured to display one or more design elements of a circuit design, the one or more design elements including the first parameterized figure group, and the GUI displaying the figure of the parameterized figured group based upon one or more attributes of the first parameterized figure group stored in a database; generating, by the computer, a template of the figure group in the database, the template comprising one or more parameters corresponding to the one or more attributes of the first parameterized figure group; updating, by the computer, one or more parameters of a record of the parameterized figure group associated with the figure of the parameterized figure group according to one or more inputs received via the GUI; generating, by the computer, in the database a record of a second figure having the one or more attributes corresponding to the one or more parameters of the template, and generating the figure of the second parameterized figure on the GUI; updating, by the computer, the one or more parameters of the template in the database in accordance with one or more inputs received via the GUI; updating, by the computer, the one or more attributes of the first parameterized figure group and the second parameterized figure group, upon updating the one or more parameters of the template; and updating, by the computer, the figure of the first parameterized figure group and the figure of the second parameterized figure group displayed on the GUI, in accordance with the attributes of the first parameterized figure group and the attributes of the second parameterized figure group.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

FIG. 10 is a flow diagram illustrating a method editing of a fluid parameterized figure group of an electronic circuit design, according to an exemplary embodiment.

DETAILED DESCRIPTION

Figure 1:
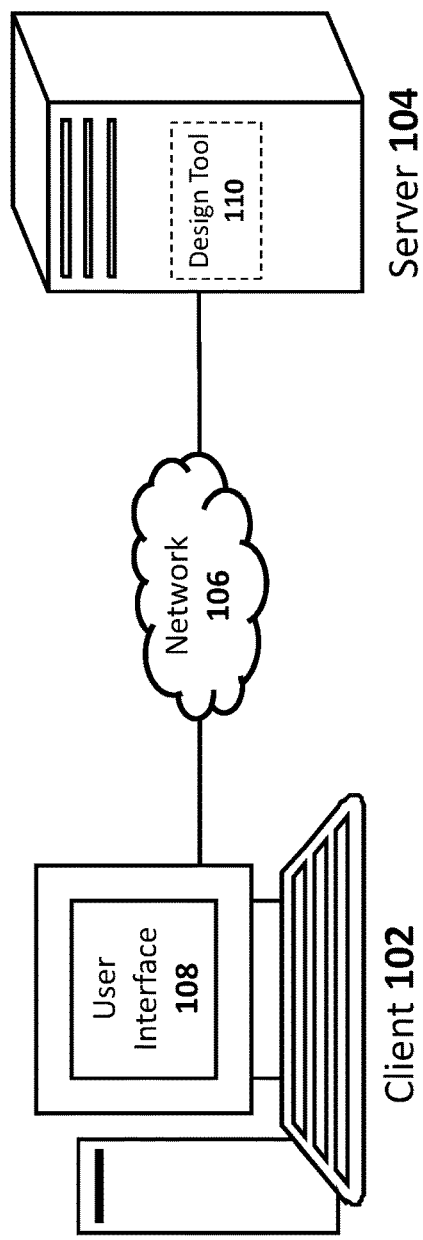
FIG. 1 illustrates an electronic design automation system, according to an exemplary embodiment.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments described herein include methods and systems for generating a programmable figure group (sometimes referred to as parameterized figure group) that contains data describing features of an electronic circuit design and may be logical representations generated on a design GUI, which may allow for user (e.g., designer, engineer) editing of components of the electronic circuit design, such as a parameterized figure group. The embodiments of the present disclosure may be implemented in electronic design automation (EDA) technologies, such as a custom integrated circuit (IC) design system, having a graphic circuit designer interface or layout editor running program code to assist a circuit designer to generate and implement customized electronic circuit designs. Although the present disclosure can be implemented to run with custom design systems, it is understood that the present disclosure is not limited to the embodiments described herein; some embodiments may be implemented with known or later-developed EDA technologies or hardware description languages, capable of generating parameterized figure groups, and manipulating the parameterized figure groups to create and produce electronic circuit layout designs.

A parameterized figure group may be a logical collection of design components of a circuit design. The parameterized figure group may include one or more database records of design components that are logically grouped together, and/or may include a visual display on a design GUI resulting from the logically grouped design components. In some implementations, the records of the database may contain content, such as attributes of components, dynamically created based on a set of parameters, which may dynamically generated based on the interactions with the GUI or may be directly inputted from a user into particular GUI fields configured to accept the parameters. After being logically grouped together, the system may generate a new component record in the database based on parameters and other data fields of the logically grouped components of the parameterized figure group. The attributes of the parameterized figure group may include a piece of code in a given language, a list of parameter types, and a default value. The language and evaluator of the parameterized figure group is implemented in a programming language such as SKILL, TCL, or Python languages. As discussed above, the parameterized figure group may be associated with a program (e.g., programmatic code, software application, executable script), a set of parameters, and values for those parameters. The content stored in a database record, in a design element database, of a particular parameterized figure group results from evaluating, or otherwise executing, the program against specified values for the parameters. Accordingly, the parameterized figure group may be instantiated as one of the design elements of an electronic circuit's underlying design and corresponding layout and may likewise be displayed on a corresponding circuit design graphical user interface (GUI). As an example, the parameters may represent two pairs of points for coordinates (x, y). The program specifies to create a polygon defined by these two pairs of points. A user may input values as the expected parameters, which, in this example, specifies the parameter values to be (1, 1) and (3, 3). The program then replaces the current existing or default content of the existing or template parameterized figure group with a polygon of coordinates, (1, 1) (3, 3). The set of parameters may include design rules and modifiable design constraints. The set of design rules may include rules such as width, height, spacing between two adjacent intra-layer figures, and overlap between two interlayer figures. The set of design constraints may include rules, such as the width and length of a gate of an IC component, such as a Metal-Oxide Semiconductor (MOS) device, and a set of circuit designer constraints, such as a die aspect ratio.

In some embodiments, the system may generate and store a parameterized figure group template, as designed by a user. The parameterized figure group template is a template of a particular parameterized figure group having a set of default parameter values that may be reused, by instantiating another instance of the particular parameterized figure group based on the template. In operation, the system may evaluate the parameterized figure group content stored in the database record of the figure group against the template default parameters in order to produce a new design with updated data. This new design is referred to herein as a new parameterized figure group, where a new parameterized figure group may be a variant of a parameterized figure group, but a variant that contains the results of the evaluation of the parameterized figure group implementation function against the parameterized figure group template default parameter values.

In some instances, a parameterized figure group of the present disclosure may reduce design entry time and design rule violations while providing an accelerated level of design automation to minimize tedious and repetitive layout tasks. The parameterized figure group may be used to support the ability of the circuit designers to change the size, shape, or contents of each figure/object of the parameterized figure group without manually changing the original content. By lowering to the component level of the design, the parameterized figure group may simplify the manner in which complex shapes and devices can be generated, edited, and managed with variable settings, thereby accelerating layout tasks and reducing design violations.

FIG. 1 illustrates an electronic design automation system 100, according to an exemplary embodiment. The electronic design automation system 100 includes a client 102 and a server 104. The client 102 is connected to the server 104 via a network 106. The network 106 refers to a medium that also connects various computing devices and database of the system 100. Examples of the network 106 include, but are not limited to, LAN, WLAN, MAN, WAN, and the Internet. The communication over the network 106 may be performed in accordance with various communication protocols such as Transmission Control Protocol and Internet Protocol (TCP/IP), Circuit designer Datagram Protocol (UDP), and IEEE communication protocols.

A client computing device, or client 102, may be any computing device comprising a processor and capable of executing the various tasks and processes described herein, such as generating, displaying, updating, and receiving inputs from a circuit designer graphical user interface, GUI 108. Non-limiting examples of the client computing device 108 may include a desktop computer, a laptop, a personal digital assistant (PDA), a tablet computer, and the like. The client 108 may be capable of communicating with the server 104 through one or more computing and/or telecommunications networks 106, using wired or wireless communication capabilities.

The client 102 facilitates a circuit designer accessing a memory device (not shown) in the server 104. The memory device, for example, stores electronic design layouts and pattern libraries. In an embodiment, layout rules for the layouts are derived from design rules of a fabrication process. The layout rules include limitations on the design features that require adjustments to the features and shapes. In one example, the layout rules may include rules for the sizing and spacing of features such that compliance with the rules may require the addition, removal, or resizing of shapes. These layout rules may be defined using the SKILL language, for example.

A server 104 may be any computing device comprising a processor and non-transitory machine-readable storage media capable of executing the various tasks and processes described herein, and may be accessible to clients 102 via the one or more networks 106. The circuit designer interface 108 may receive instructions regarding a layout design from the circuit designer, and utilizes the optimization procedures stored in the memory device to facilitate optimization of the layout design and the execution of the editing process. The server 104 further has a design tool 110. The design tool 110 may have access to the memory device (e.g., store data, update data, query data, retrieve data), and may be configured to facilitate the analysis of the design layout to identify features for editing and perform the editing procedures described herein. The circuit designer may interact with the design tool 110 through a number of input devices such as by inputting a selection as with a mouse or inputting a request as with a keyboard. The circuit designer may observe the response to the access request on an output device or display. The design tool 110 may run in an application window controlled by the circuit designer.

In another embodiment, the client 102 may execute a design tool and may also have access to a memory device. The client 102 may be any computing system that executes the design tool or otherwise facilitates access to a database or other memory device storing layouts, pattern libraries, netlist files, and/or templates. In yet another embodiment, multiple different clients 102 may access the memory device via the networks 106 and request access to the objects stored therein.

Figure 2:
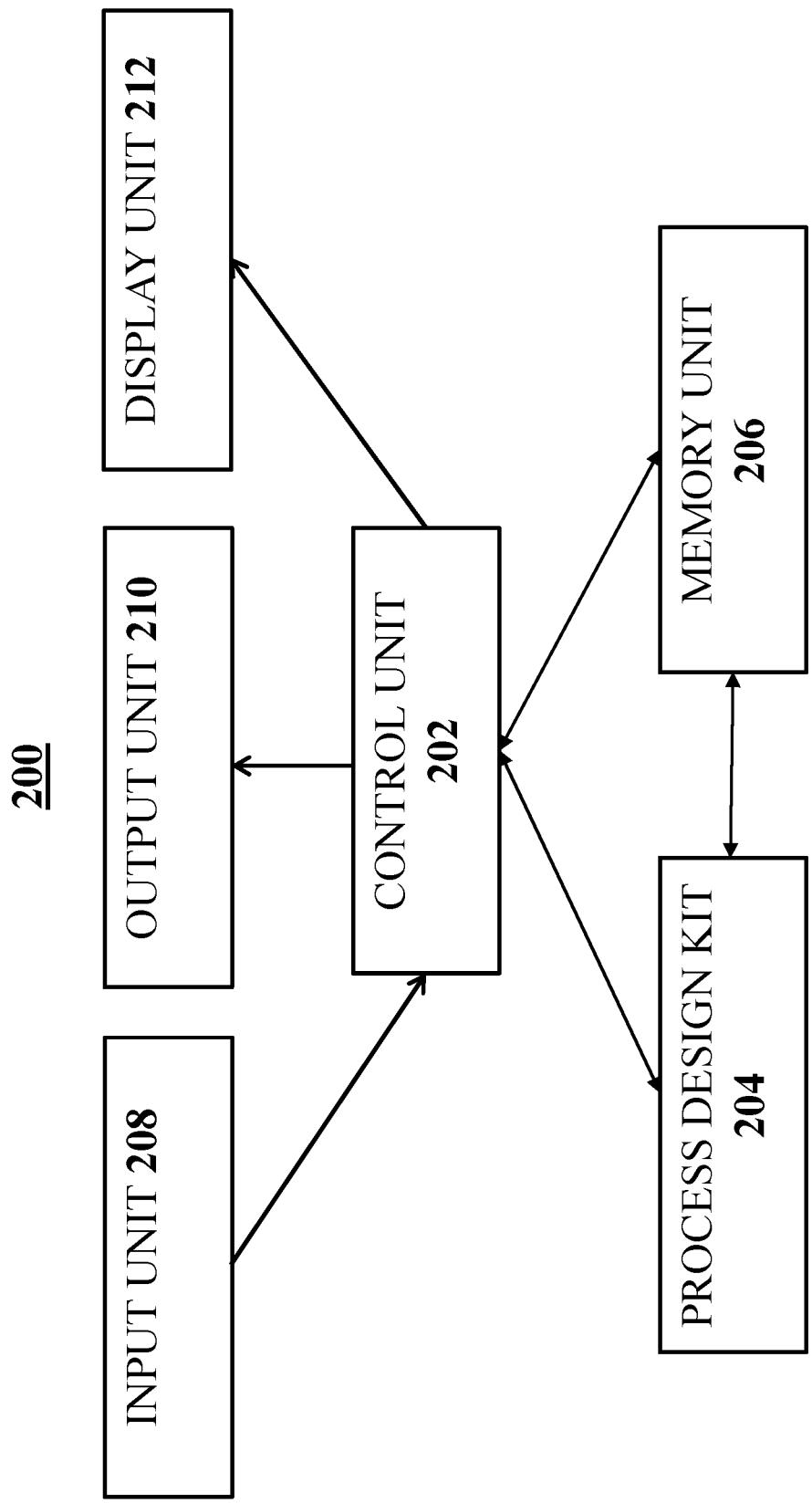
FIG. 2 is a block diagram depicting components of an electronic design automation system, according to an exemplary embodiment.

FIG. 2 is a block diagram depicting components of an electronic design automation system 200, according to an exemplary embodiment. The system 200 includes a control unit 202, a process design kit (PDK) 204, a memory unit 206, an input unit 208, an output unit 210, and a display unit 212. In one implementation, the components of system 200 may be connected via an interconnect bus. In another implementation, the control unit 202 and the memory unit 206 may be connected via a local processor bus, and the remaining units of the system 200 may be connected via one or more input/output buses. For the purposes of the discussion in FIG. 2, the system 200 may be one or more computing devices, such as clients and/or servers described in FIG. 1.

A control unit 202 implements a processor system to control the operations of the system 200. The control unit 202 may include a single processor or a plurality of processors, where a processor includes executable logic, circuitry, and interfaces that are operable to execute one or more instructions to perform predetermined operations/tasks. The processor of the system 200 may include any number of processor technologies known in the art. Non-limiting examples of the processor of the control unit 202 may include an x86 processor, an ARM processor, a Reduced Instruction Set Computing (RISC) processor, an Application-Specific Integrated Circuit (ASIC) processor, or a Complex Instruction Set Computing (CISC) processor. In some cases, the control unit 202 may include a Graphics Processing Unit (GPU) that executes the set of instructions to perform one or more processing operations for graphical outputs, separate from the processor. The control unit 202 may further include a software-based graphic design environment executing software programs to assist the circuit designer in generating and streamlining layout designs.

A PDK 204 may be software instructions executable by the control unit 202, or any number of other components of the system 200, and may contain information specific to a particular design task (such as editing functions) and other tasks including libraries of symbols, views, and binary files provided in various machine-readable file formats. The PDK 204 has an interface interconnected with the control unit 202 to enable a circuit designer to access cell level design solutions and optimize layout designs interactively via the input unit 208 and the display unit 212. The assortment of libraries of the PDK 204 can be collections of one or more circuit designs stored in digital formats, and may be accessible by the control unit 202. The circuit design may be any circuit design that includes digital logic elements. The examples of digital logic elements include AND gates, OR gates, NOT gates, NOR gates, NAND gates, XOR gates, XNOR gates, and/or combinational logic circuits, such as flip-flops, shift-registers, multiplexers and de-multiplexers. The examples of the electronic circuit design include a microcontroller unit (MCU), system-on-chip (SOC), and application specific integrated circuit (ASIC) design. The digital content of the library may be stored locally, or accessed remotely via a computer network.

A memory unit 206 is a non-volatile storage device for storing data and instructions, to be used by the control unit 202 and/or other components of the system 200. The memory unit 206 is implemented with a magnetic disk drive, an optical disk drive, a solid state device, or an attachment to network storage. The memory unit 206 may comprise one or more memory devices to facilitate storage and manipulation of program code, set of instructions, tasks, electronic designs, data, PDKs, and the like. Non-limiting examples of memory unit 206 implementations may include, but are not limited to, a random access memory (RAM), a read-only memory (ROM), a hard disk drive (HDD), a secure digital (SD) card, a magneto-resistive read/write memory, an optical read/write memory, a cache memory, or a magnetic read/write memory. Further, the memory unit 206 includes one or more instructions that are executable by the processor of the control unit 202 to perform specific operations. The support circuits for the processor include conventional cache, power supplies, clock circuits, data registers, I/O interfaces, and the like. The I/O interface may be directly coupled to the memory unit 206 or coupled through the processor of the control unit 202.

An input unit 208 may be a keyboard, mouse, pointer, or other input generating device to facilitate input of control instructions by the circuit designer to the control unit 202. In one embodiment, the input unit 208 provides a portion of the circuit designer interface for the system 200, and may include an alphanumeric keypad for inputting alphanumeric and other key information along with a cursor control device such as a mouse, a trackpad or stylus. An output unit 210 of the system 200 facilitates physical implementation of a circuit designers' custom designs by providing a direct link to manufacturing processes at a silicon level or a chip level. A display unit 212 of the system 200 may include a cathode ray tube (CRT) display, liquid crystal display (LCD), plasma, or light emitting diode (LED) display. A graphics subsystem may receive textual and graphical information and process the information for output to the display unit 212.

In one embodiment, parameterized figure group (PGroup) provided with the PDK 204 may be accessed by the circuit designer by way of a graphical circuit designer interface or layout editor visualized by the display unit 212. The display unit 212 may also visualize a graphical circuit designer interface or layout editor having a design mode and an edit mode to enable generation and editing of custom electronic circuit designs.

Figure 3:
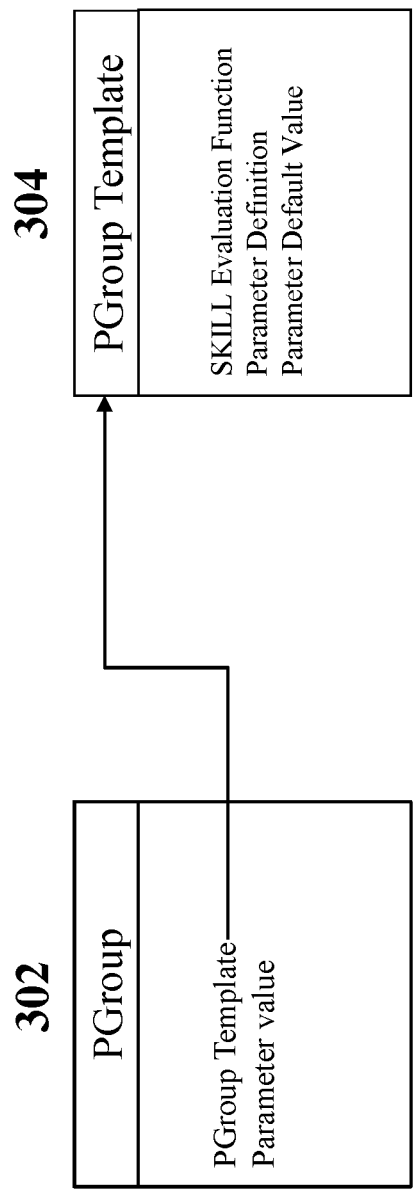
FIG. 3 illustrates an exemplary architecture of parameterized figure group (PGroup) of an electronic circuit design, according to an exemplary embodiment.

FIG. 3 illustrates an logical, hierarchical architecture of parameterized figure group (PGroup) 302 of an electronic circuit design with respect to a template 304, according to an exemplary embodiment. A figure may be any type of shape, an instance of another design element, a figure group, and/or any object useful for designing the electronic circuit. A figure group 302, sometimes referred to as a "figGroup," may be a collection of figures that represent on a GUI the data records of design elements stored in design database. In some cases, a figure group 302 can contain, among other things, another figure group; thus, figure groups 302 can be hierarchical. The figures may be displayed on GUI to represent the design of physical shapes, and may be displayed as shapes (e.g., rectangles, polygons, lines, paths, arcs, ellipses, dots, donuts).

A PGroup 302 may be created by parameterizing the figure group. The created PGroup 302 is a programmable or parameterized figure group that allows creation of a customized instance of the PGroup 302 each time the PGroup 302 is placed or used in the electronic circuit design. The PGroup 302 is flexible as compared to regular figure group representing circuitry because different figures of the PGroup 302 may have different parameter values, whereas other figures may be more static. For example, with the PGroup 302, parameter values stored in a database, such as the length, width, and/or other design elements of the figure, can be realized by simply inserting or changing one or more parameter values of the PGroup 302 or otherwise manipulate the graphical representation of the PGroup 302 displayed on the design GUI. Rather than having many different figure attribute definitions to represent the variously-sized devices (e.g., transistor) in a given design, a single PGroup 302 may receive and store a device's (e.g., transistor) dimensions, such as length and width as parameters, with respect to multiple devices grouped into the PGroup 302. Instances of a single PGroup 302 can then represent the transistors of different sizes.

The PGroup 302 may exist at different levels. It also should be appreciated that the circuit designer can create any number of levels in any given PGroup 302. The PGroup 302 may be associated with a PGroup template 304 and parameter values. The PGroup template 304 is encoded in a computer readable device and is associated with a list of parameters, parameter types, parameter default values, and with logic in the form of computer program code usually written in a programming language such as SKILL. The circuit designer may specify parameter values of the parameters for the PGroup template 304.

In some embodiments, an automated design tool uses the logic of the PGroup template 304 to generate new parameterized figure group (new PGroup), that complies with the circuit designer-specified parameter values. In a typical session of an automated design tool usage, regular instances of the same PGroup template 304 that share the same parameter values typically will also share the same new PGroup. The new PGroup is created by evaluating PGroup code associated with the PGroup template 304 for a given unique set of parameter values. The new PGroup is created in-memory such as volatile memory on demand for each unique set of parameters associated with instances in an open design. The new PGroup which receives properties from the associated PGroup template 304 typically resides in virtual memory, and contains geometries produced by a set of parameter values. In some cases, the in-memory PGroup may be saved to disk when the designer saves the design database to disk.

The edits of the PGroup content may be made automatically through a component of the EDA tool or can be made through use of the application programming language of the EDA system. The actual shapes that comprise the PGroup may be created by a function associated with the PGroup 302 usually written in a programming language such as SKILL. In another embodiment, the new PGroup can be created without evaluating the PGroup code and by editing the existing PGroup 302 and then binding the new PGroup to selected instances of the original PGroup 302. In such a case, the circuit designer can make manual edits of the PGroup 302 content by hand through the graphical circuit designer interface. The PGroup 302 instance(s) which inherit parameters and content from the associated new PGroup by means of being bound to that new PGroup resides in the virtual memory. The PGroup 302 instances can be associated with a set of parameter values, and each group of the PGroup instances which have the same parameter values bind to the new PGroup.

In some implementations, the circuit designer may use the layout editor to create new PGroup content using layout-editing techniques, as applied to an existing PGroup template 304. But in some implementations, PGroup contents can only be edited by editing PGroup parameters. In such implementations, in order to edit the objects within the PGroup, the user may instruct the software to execute a "flatten" routine on the figGroup. When executed, the flatten routine moves the PGroup content outside of the PGroup, and deletes the PGroup; these move and delete sub-routines may effect changes both logically, in the underlying data, and visually, as an update to the GUI representation of the design. After executing the flatten routine, the moved objects are editable individually.

If using an EDA layout platform built on the OpenAccess (OA) database for interoperability support between electronic design tools, though any database may be implemented, OA imposes some changes on the design data such that the design data is more compact and easier to comprehend by multiple design tools. SKILL is the primary language for writing PGroup 302 code, and with OpenAccess other languages have also become available. The required edits to use the PGroup 302 is to update any SKILL which manipulates parameters on the PGroup 302 instances.

Figure 4:
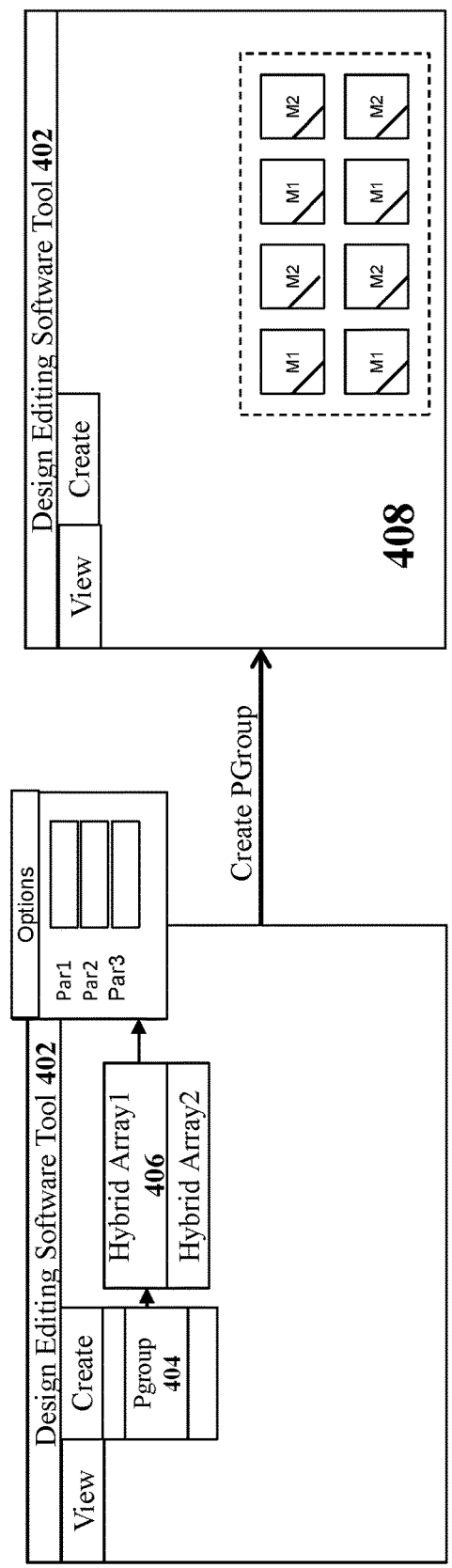
FIG. 4 illustrates generation of a parameterized figure group (PGroup) of an electronic circuit design, according to an exemplary embodiment.

FIG. 4 illustrates generation of a parameterized figure group (PGroup) of an electronic circuit design, according to an exemplary embodiment. A design editing tool 402, such as a layout editor, may be used by circuit designers to create or edit electronic circuit designs. Any suitable computer aided design (CAD) tool or electronic design automation (EDA) design tool may be used as a layout editor.

In the illustrated embodiment, a figure group may be created or selected that includes a collection of figures and/or objects. The figures may be any types of shape (e.g., rectangles, polygons, lines, paths, arcs, ellipses, dots, donuts), an instance of another design element, a figure group, and/or any object useful for designing the electronic circuit. The design editing tool 404 may use databases for storing figures/objects defining portions of layout for the electronic circuit design, such as portions of layout for a plurality of nets in the electronic circuit design. For example, one database which can be used by the design editing tool 404 is OpenAccess (OA) database.

A circuit designer then invokes a command 404 on the design editing tool 404 to create a programmable or parameterized figure group (PGroup) 408. The circuit designer further selects a template 406 from a list of templates, and associates the template 406 comprising a piece of code in a given language, a list of parameter types, and a default value to the figure group to create the PGroup 408. In an embodiment, the circuit designer may define the list of parameter types, and further assign the default value to the each of the parameters. The language and evaluator of the figure group that is programmable is implemented in a programming language such as SKILL, TCL, or Python languages. The templates are typically stored in the OpenAccess (OA) database. In an alternate embodiment, the circuit designer may create a new template and associate the new template to the figure group to create the PGroup 404. The actual shapes that comprise the PGroup 408 may be created by a function associated with the PGroup 408 written in a programming language such as SKILL.

Figure 5:
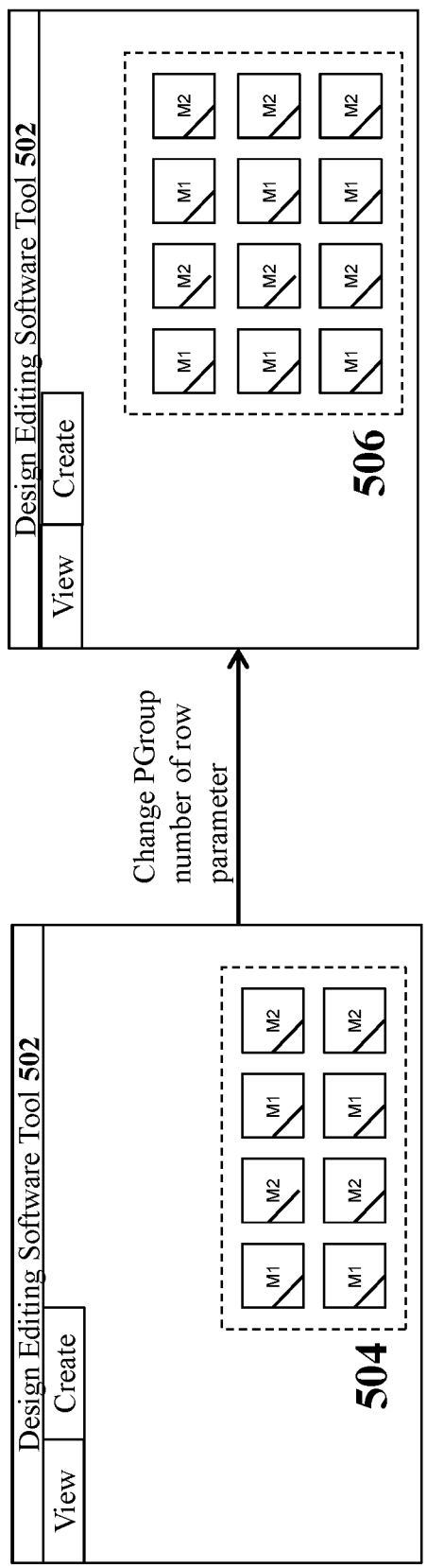
FIG. 5 illustrates editing of a parameterized figure group (PGroup) of an electronic circuit design, according to an exemplary embodiment.

FIG. 5 illustrates editing of a parameterized figure group (PGroup) of an electronic circuit design, according to an exemplary embodiment. A circuit designer may select a PGroup 504 using a design editing tool 502 such as a layout editor and then invoke an edit command. The circuit designer may evaluate the PGroup 504 by changing one or more parameters of a template associated to the PGroup 504. The template of the PGroup 504 has the PGroup 504 default parameter values. The change of the one or more default parameter values of the PGroup 504 results in evaluation of the PGroup 504 code against the template default parameters in order to produce a new design 506 with updated data. The new design 506 is a new parameterized figure group that contains the results of the evaluation of the PGroup 504 implementation function against the PGroup 504 template default parameter values.

Figure 6:
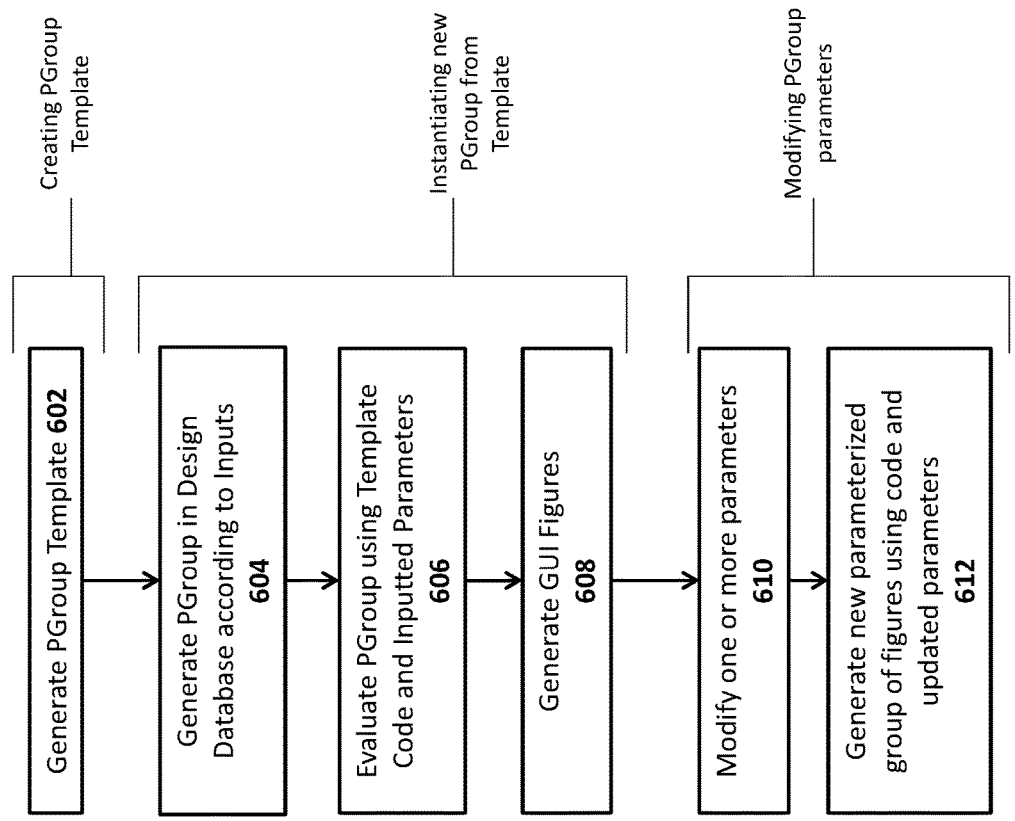
FIG. 6 is a flow diagram illustrating a method of generation and editing of a parameterized figure group (PGroup) of an electronic circuit design, according to an exemplary embodiment.

FIG. 6 is a flow diagram illustrating a method 600 of creating a parameterized group (PGroup) template, instantiating a new PGroup, and editing PGroup, according to an exemplary embodiment.

At step 602, a processor generates a PGroup template. In this step, a user operating circuit design software (e.g., EDA software) executed by the processor, may enter a series of inputs instructing the system to generate a new PGroup template for the circuit design. The inputs and software may specify a list of parameters, a list of default values for those parameters, and an executable function in programmatic code (e.g., SKILL, python, TCL) that will be used later on to evaluate the PGroup. After the PGroup template is generated, the template and the underlying data may be stored in one or more records of the design database (e.g., OpenAccess database) storing the design element data for the ongoing circuit design project.

At step 604, the processor generates an instance of a PGroup using the new PGroup template and a set of corresponding inputs received from a user (e.g., circuit designer). A circuit designer may invoke a command on a design layout interface GUI to create an instance of a new PGroup. Contemporaneously, the circuit designer may select a PGroup template as the foundation for the new PGroup, which the designer may select from a list of one or more templates stored in the design database. The designer may also input a set of one or more parameter values expected by the code of the PGroup template. In some instances, the code or the software may be configured to store, input, or otherwise execute one or more default parameter values, which may be particularly useful in circumstances where the user does not input parameter values expected by the code.

At step 606, the processor may evaluate the parameter values using the code associated with the PGroup template. Here, the processor may execute the code stored in the database in the record of the PGroup template, using inputted parameter values and/or default parameter values. The new PGroup will be created in the database, as a new record of a new design element corresponding to the new PGroup. Contemporaneously, in step 608, the programmatic code associated with the PGroup template will be executed to evaluate the parameters, and the processor will create the constituent grouped figures for the new PGroup, which may then be displayed in the design GUI.

As exemplified by a series of exemplary steps below, in some circumstances a user may edit, revise, update, or otherwise change the parameters of a particular PGroup that has been instantiated using a corresponding PGroup template.

In such circumstances, at a next step 610, the processor may modify one or more parameters of the PGroup in response to receiving an edit instruction from the GUI. Here, the designer may input new parameter values into the GUI interface associated with the edit instruction, which may then call or otherwise instruct the processor to execute the code associated with the corresponding PGroup template. The processor may then evaluate the parameters inputted from the GUI by executing the code of the PGroup template.

In a next step 612, after executing the code and evaluating the parameters, the processor may generate a new parameterized figure group (new PGroup), which may be stored as a new design element into the design database. In the exemplary embodiment, the processor generates and stores a new record for the new PGroup, containing data generated by the processor according to the modified parameters inputted by the designer when instructing the design software and processor to modify the pre-existing PGroup. In some implementations, the processor and/or design database may delete stored data and/or records associated with the pre-existing PGroup. Before or after the stored content and GUI figure for the pre-existing PGroup are deleted, the processor may generate and store the new content and/or GUI figure for the new PGroup, by evaluating the stored code (e.g., SKILL code) function against the modified list of parameters. In some embodiments, rather than deleting the content and/or GUI figure of the pre-existing PGroup, the processor updates the contents and GUI figure of the pre-existing PGroup according to the modified list of parameters and the executed code.

Figure 7:
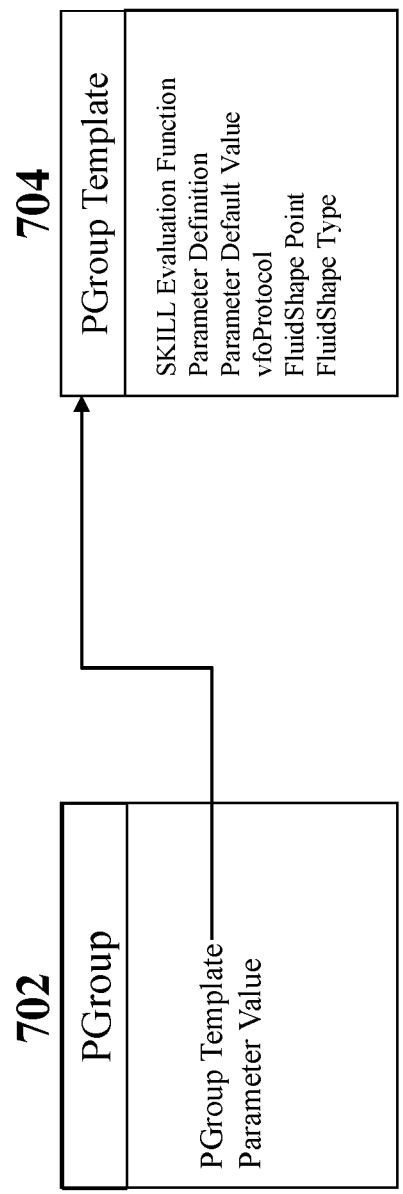
FIG. 7 illustrates an exemplary architecture of a fluid parameterized figure group of an electronic circuit design, according to an exemplary embodiment.

FIG. 7 illustrates an exemplary architecture of a fluid parameterized figure group (fluid PGroup) 702 of an electronic circuit design, according to an exemplary embodiment. The fluid PGroup 702 allows for implementing electronic designs that allows visual editing of complex figures and/or objects with advanced editing features. The fluid PGroup 702 further provides for automated correspondence of the editing results to parameterized values for a programmable figure and/or object in the electronic circuit design.

A programmable or parameterized design is defined in a way to implement the fluid PGroup 702 having a shape that is capable of being visually edited by a design editing tool or layout editor. The shape is also referred to as fluid shape. The fluid PGroup 702 has content that is dynamically created based on a set of parameters, among other potential attributes. Non-limiting examples of the attributes of a fluid PGroup 702 may include a piece of code in a given language (e.g., SKILL, TCL, Python), a list of parameter types, and a list of parameter default values. The code may correspond to an evaluator function used by the design software to generate content for the fluid PGroup 702 and/or generate a graphical figure representing the fluid PGroup 702. Once generated from evaluating the parameters using the stored code, the content of a fluid PGroup 702 is not editable directly by the user. In some instances, the fluid PGroup 702 content may be partially-editable by the user who is limited to editing a fluid shape attribute of the fluid PGroup 702. However, any other object or attribute of the fluid PGroup 702 cannot be edited. Instead, attributes and other aspects of the fluid PGroup 702 may only be generated by evaluating the stored code automatically, when the design software calls the PGroup template-updating routines that cause the processor to execute the stored code and evaluate a list of new or modified parameters.

In the illustrated embodiment, the fluid PGroup 702 is associated with a PGroup template 704 and parameter values. The PGroup template 704 is encoded in a computer readable device and that is associated with a list of parameters, parameter types, parameter default values, logic in the form of computer program code, VFO protocol (editing function), fluid shape point, and fluid shape type. A circuit designer specifies parameter values of its parameters for the PGroup template 704. During the evaluation of the fluid PGroup 702, the fluid PGroup 702 code is mapped against the PGroup template 704 default parameters in order to produce a new design with updated data. This new design is referred to herein as a new PGroup. The new PGroup is the fluid PGroup 702 variant that contains the results of the evaluation of the new PGroup implementation function against the parameterized figure group template default parameter values.

The implementation function is used to specify the existence and identity of the fluid shapes of the fluid PGroup 702 to the design editing tool or the layout editor. The implementation function provides the layout editor with the information to know about and be able to edit the fluid shapes of the fluid PGroup 702. Once the editing tool has been used by a circuit designer to edit the fluid shape of the fluid PGroup 702, an editing function is employed to make and propagate the corresponding changes to the programmable or parametric design elements or figures of the fluid PGroup 702. A circuit designer is then able to use interfaces and controls in a layout editor to edit parametric shapes without requiring the layout editor to know about the specific parameters and details of those shapes of the fluid PGroup 702. As discussed above, the content of a fluid PGroup 702 is not editable directly by the user, though, in some instances, the fluid PGroup 702 content may be partially-editable to allow for limited editing of a fluid shape attribute of the fluid PGroup 702. However, any other object or attribute of the fluid PGroup 702 cannot be edited directly. Generating or modifying a fluid PGroup 702 is limited to processor evaluations of the stored evaluation code associated with the fluid PGroup 702.

Figure 8:
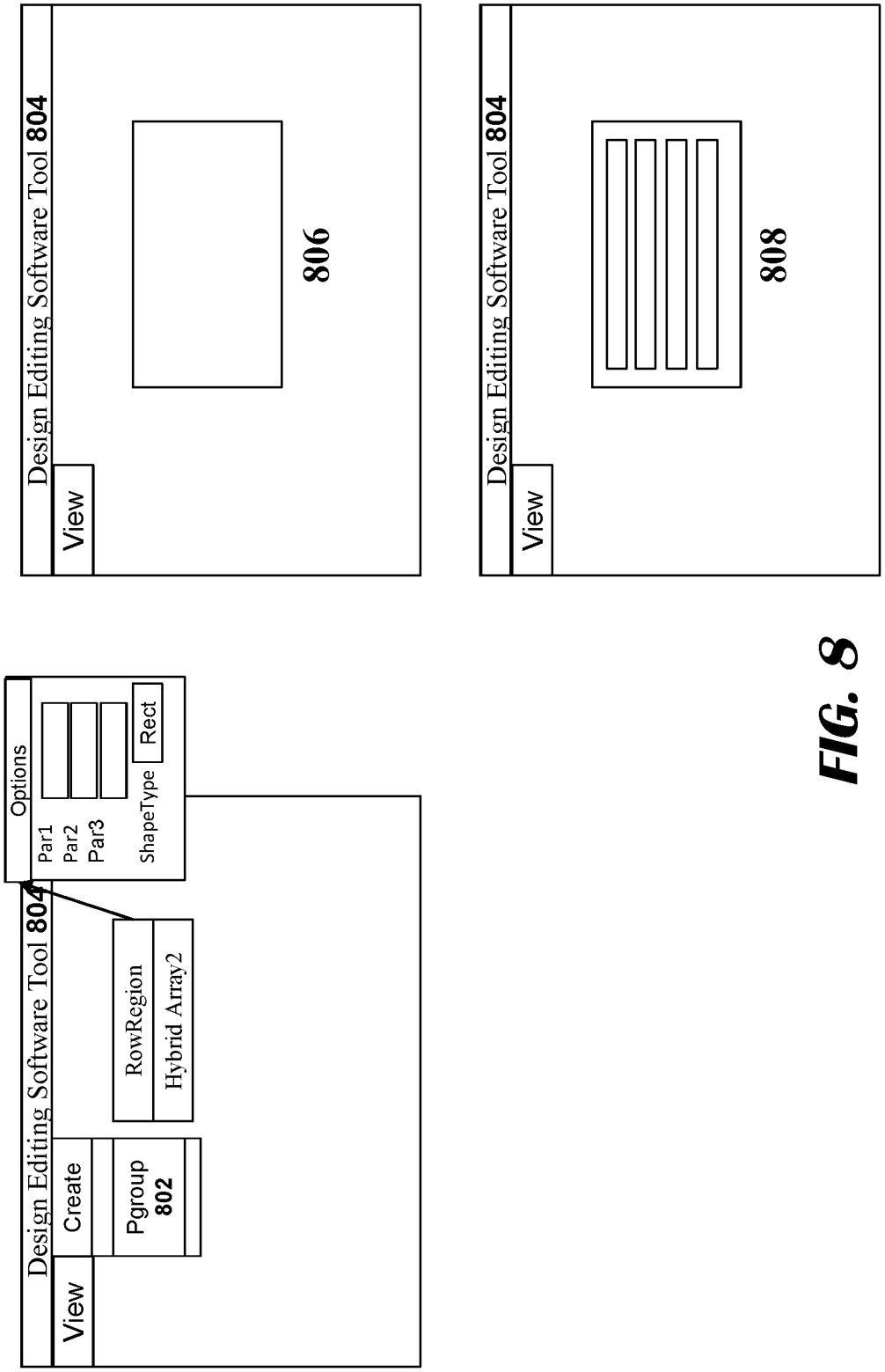
FIG. 8 illustrates generation of a fluid parameterized figure group of an electronic circuit design, according to an exemplary embodiment.

FIG. 8 illustrates generation of fluid parameterized figure group of an electronic circuit design, according to an exemplary embodiment. A design editing tool 804 such as a layout editor, may be used by circuit designers to create or edit electronic circuit designs. Any suitable computer aided design (CAD) tool or electronic design automation (EDA) design tool may be used as a layout editor. In the illustrated embodiment, a parameterized figure group (PGroup) is created/generated 802 on the design editing tool 804 by a circuit designer. The created PGroup 802 is capable of being visually edited and/or operated upon with advanced editing methodologies. The PGroup 802 is hereinafter referred to as a fluid parameterized figure group (fluid PGroup).

The fluid PGroup 802 has an implementation function that creates fluid shapes that can be visually edited. For example, a circuit designer may select a rectangle to be a fluid shape. The circuit designer on the design editing tool 802 such as a layout editor then instantiates an empty fluid PGroup and set the rectangle as the fluid shape 806. The instantiated fluid PGroup is then filled and a fluid shape 808 is created. In the illustrated figure, the fluid shape 808 has a collection of rows. In an embodiment, the fluid shape 808 is the parameterized shape in the design that can be visually edited by the user using design editing tool 804 such as the layout editor. The implementation function is defined to provide a functionality to specify the fluid shapes 808 in the PGroup 802, by tracking the fluid shape information and using the fluid shape information to allow the design editing tool 804 such as the layout editor to discriminate between fluid shapes and regular shapes of the PGroup 802. The recognition of the fluid shapes 808 by the design editing tool 804 such as the layout editor allows the circuit designer to select and edit the fluid shapes 808 using the design editing tool 804 such as the layout editor. According to some embodiments, the implementation function may be implemented as a SKILL function that is called via an application programming interface (API) from the design editing tool 802.

In some embodiments, the fluid shapes 808 may also be "tagged" to identify as the fluid shapes 808 in the PGroup 802 to distinguish the fluid shapes 808 from non-fluid shapes within the PGroup 802. The tag associated with the fluid shape 808 is used to identify specific fluid shapes 808 in the PGroup 802. In an alternate embodiment, the tag can be used for other purposes with respect to the PGroup 802, in addition to its function with regard to naming for the PGroup 802 such as for adding a property or adding an extension.

An editing function of the PGroup 802 is then defined and configured. The type of editing that will be implemented for the PGroup 802 is identified since different types of editing may be associated with different and/or separate editing functions and functionality. The software then identifies the parameters that may be affected by the anticipated editing functionality. An updating function is then created for the PGroup 802. The updating function is used to update the PGroup 802 parameters based upon editing results created by the circuit designer.

Figure 9:
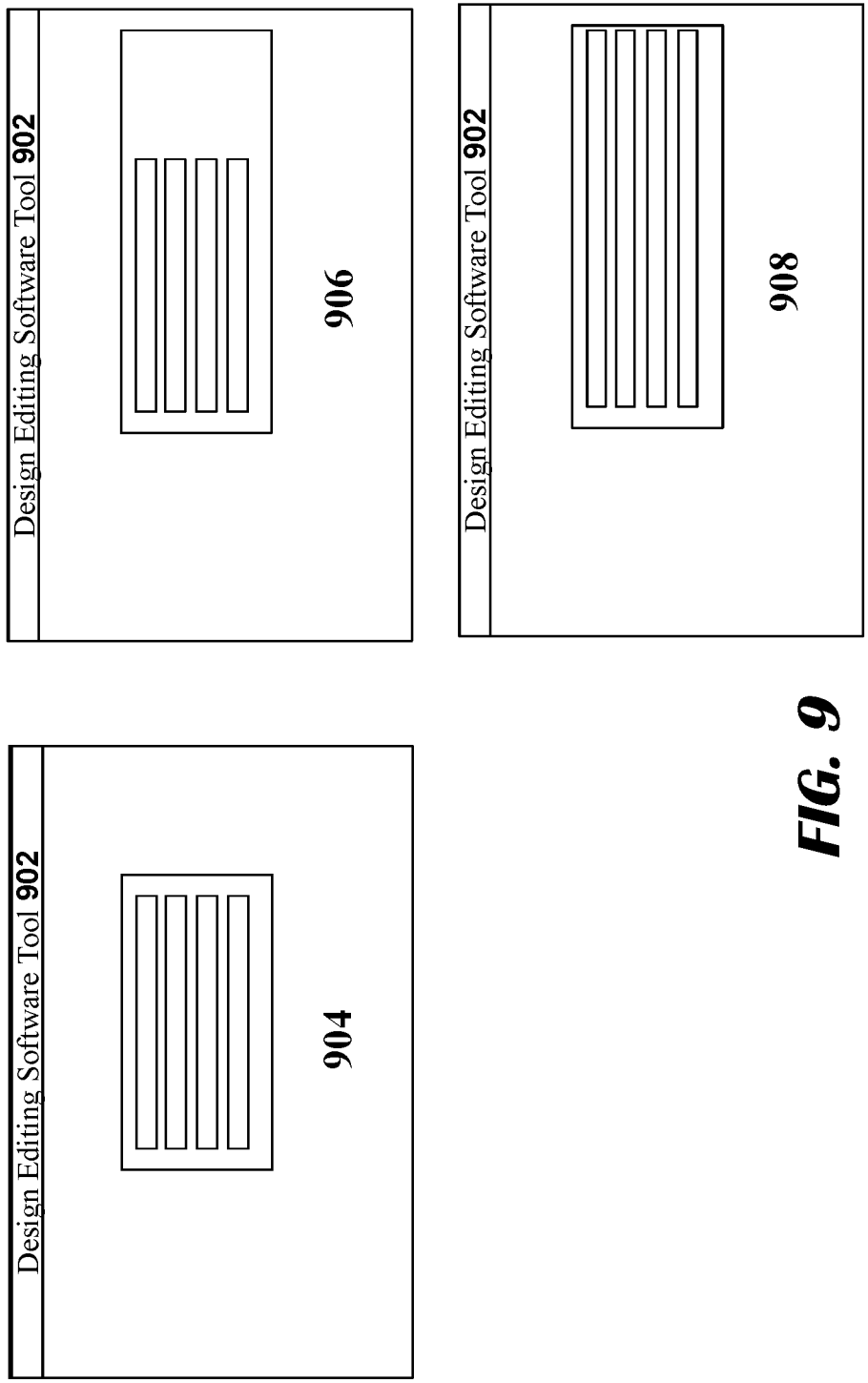
FIG. 9 illustrates editing of a fluid parameterized figure group of an electronic circuit design, according to an exemplary embodiment.

FIG. 9 illustrates editing of fluid parameterized figure group of an electronic circuit design, according to an exemplary embodiment. The fluid parameterized figure group (fluid PGroup) is associated with one or more editing functions that are used to make changes to the fluid PGroup corresponding to any changes made by a circuit designer with a design editing tool 902 such as a layout editor. In an embodiment, an interface is provided to allow the design editing tool 902 such as the layout editor to interact with an implementation function and/or the editing functions. The interface may be implemented with hooks to the editing functions and/or creation functions that may be employed to generate fluid PGroup templates. According to some embodiments, standardized function prototypes and/or APIs are utilized to allow the design editing tool 902 such as the layout editor to properly interact with the editing function or the implementation function.

For purpose of editing the fluid PGroup, an instance is created for the fluid PGroup based upon a associated fluid PGroup template. The fluid PGroup instance includes a fluid shape 904 created by the implementation function that is editable using one of the editing functions. The fluid PGroup is then evaluated using a given set of parameter values to create an instantiation of the design elements that correspond to the fluid PGroup. The instantiation forms a set of objects that exist on the layout of the electrical circuit design. The layout editor is then notified of the nature of the fluid PGroup being a fluid PGroup having one or more fluid shapes. Accordingly, the design editing tool 902 such as the layout editor executes the editing function to implement any edits or changes to the fluid PGroup that is desired by the circuit designer.

After the circuit designer has edited the fluid PGroup, the one or more editing functions are employed to realize and propagate the changes to the fluid PGroup. For example, the circuit designer may edit the fluid shape 904 by stretching the right edge of the fluid shape 904. The stretched version of the fluid shape is shown at 906. In an embodiment, any appropriate editing functionality may be implemented by the editing function including but not limited to update function; merge function; chop function; compacting function; convert function; obstruction function; and abutting function without moving out from the scope of the disclosed embodiments. According to an embodiment, the editing functions may be implemented as SKILL functions which update parameters of a given fluid PGroup instance. For example, the update function may be used to implement updates to the parameters that reflect the editing performed by the circuit designer upon a fluid shape 904 within the fluid PGroup instance. The merge function, chop function, compacting function, convert function, obstruction function, and abutting function may also be used to perform edits to selected fluid PGroup instances. These editing functions may themselves call the update function with regard to any instance edits that involve changes to fluid shapes 904 within the fluid PGroup instances.

In the illustrated embodiment, the circuit designer is able to use the design editing tool 902 such as the layout editor to visually edit the fluid PGroup instance and/or the fluid shape 904 using a graphical user interface, as opposed to or in addition to allowing the fluid PGroup instance to be programmatically edited. This allows the circuit designer to graphically manipulate either the fluid PGroup or its fluid shape 904 in a visual manner with immediate visual feedback of the editing results. The visual edits that are made to the fluid PGroup or fluid shapes 904 are correspondingly made to the appropriate parameters within the associated PGroup template. The design editing tool 902 such as the layout editor implements the edits by calling the editing function for the specific type of edit being performed. According to some embodiments, the editing function that is called is a SKILL function which updates the shape parameters of the associated PGroup template, which then causes a new PGroup template to be created having the new shape parameters. The new shape parameters are reflected in a revised fluid shape 908 within the new PGroup template.

FIG. 10 is a flow diagram illustrating a method of editing of a fluid parameterized figure group of an electronic circuit design, according to an exemplary embodiment.

At step 1002, a figure of the parameterized figure group to be edited is identified by a processor. In an embodiment, the figure of the parameterized figure group to be edited is identified based on a tag associated with the figure. The identified figure associated with the tag is a fluid figure (fluid shape). The fluid figures are "tagged" within the parameterized figure group so that a processor can identify the fluid shapes and easily distinguish from the non-fluid shapes within the parameterized figure group.

At step 1004, the fluid figure of the parameterized figure group is then edited using a visual graphical editor interface. The editing of the fluid figure of the parameterized figure group using the visual graphical editor interface may include but not limited to stretching one or more portions of shapes, updating, compacting, chopping, merging, polygon conversion, keep-out generation or tunneling, keep-out deletion or healing, or abutment functionality. The editing of the fluid figure of the parameterized figure group may correspond to change in size, orientation, configuration, or dimensions of shapes within the figure of the parameterized figure group.

At step 1006, one or more parameters affected by the editing of the fluid figure of the parameterized figure group are identified by the processor. In an embodiment, the identification of the one or more parameters affected by the editing of the fluid figure of the parameterized figure group may include identification of a list of shapes and parameters for the shapes affected by the editing, and further calling an editing function to implement the editing of the shapes. The one or more parameters may also be identified based at least in part upon the tag associated with the fluid figure.

At step 1008, the one or more parameters affected by the editing of the figure of the parameterized figure group are modified by the processor. In an embodiment, the editing function identifies a type of editing being implemented. The editing function then identifies the one or more parameters affected by the editing, and communicates the affected one or more parameters to an updating function. The updating function then changes the parameters to conform to the editing results created by the circuit designer.

At step 1010, a new parameterized figure group is generated by the processor to reflect changes to the one or more parameters affected by the editing of the figure of the parameterized figure group. In an embodiment, the new parameterized figure group correspond to the circuit designer edits. In the new parameterized figure group generated, existence and an identity of an implementation function for the new parameterized figure group may be specified. Also, information is provided about the new parameterized figure group to an electronic design tool that may be used to edit the new parameterized figure group.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function. The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, and network transmission, among others. The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein. While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A computer-implemented method comprising:
    generating, by a computer, a graphical user interface (GUI) representing a plurality of design elements of an electronic circuit layout, in accordance with one or more attributes of each respective design element stored in a plurality of records of the design elements in a database;
    generating, by the computer, in the database configured to store a plurality of records of design elements of an electronic circuit layout, a record of a figure group based upon one or more records of one or more devices in response to receiving an instruction to generate the figure group via the GUI, the record of the figure group configured to store one or more attributes in data fields configurable via the GUI;
    generating, by the computer, in the database a record of one or more templates for the figure group, the one or more templates comprising one or more parameters corresponding to the one or more attributes in the data fields of the record of the figure group;
    generating, by the computer, a record of a parameterized figure group containing data associating the one or more templates to the figure group;
    editing, by the computer, an instance of the parameterized figure group according to one or more inputs received via the GUI, wherein the instance of the parameterized figure group is generated according to the one or more parameters;
    updating, by the computer, the one or more parameters affected based on the editing of the instance of the parameterized figure group; and
    generating, by the computer, in the database a record of a new parameterized figure group based on the one or more updated parameters.

2. The computer-implemented method of claim 1, further comprising:
    receiving, by the computer, one or more commands from one or more design layout interfaces assigned respectively to the parameterized figure group; and
    upon the computer receiving the one or more commands, modifying, by the computer, the one or more parameters associated to at least one figure of the parameterized figure group, according to a command received from a design layout interface assigned to the parameterized figure group.

3. The computer-implemented method of claim 2, further comprising updating, by the computer, contents of the at least one figure of the parameterized figure group according to the modified one or more parameters associated to the at least one figure of the parameterized figure group.

4. The computer-implemented method of claim 2, further comprising generating, by the computer, the new parameterized figure group according to the modified one or more parameters associated to the at least one figure of the parameterized figure group.

5. The computer-implemented method of claim 3, further comprising updating, by the computer, a default value of the one or more parameters according to a new value of the modified one or more parameters in the one or more templates.

6. The computer-implemented method of claim 1, wherein the one or more templates are stored on Open Access database.

7. The computer-implemented method of claim 1, wherein the figure group comprises one or more figures having geometric shapes, and wherein a geometric shape of a figure of the figure group is selected from a group consisting of: rectangle, polygon, line, path, arc, ellipse, dot, and donut.

8. A circuit design system comprising:
    a layout database hosted on one or more computing devices comprising non-transitory machine-readable memory, the layout database configured to store one or more records of one or more features of an electronic circuit layout of an electronic circuit design;
    a client device configured to execute a circuit design interface configured to display representations of the features of the electronic circuit layout, and to receive inputs from one or more input devices; and
    a design server in communication with the client device and the layout database, and comprising a processor configured to:
        generate a record of a figure group in the electronic circuit layout of the electronic circuit design;
        generate one or more templates of features comprising one or more parameters and a programming language code;
        generate a record of a parameterized figure group containing data associating the one or more templates to the figure group;
        edit an instance of the parameterized figure group according to one or more inputs received via the one or more input devices, wherein the instance of the parameterized figure group is generated according to the one or more parameters;
        update the one or more parameters affected based on the edit of the instance of the parameterized figure group, and
        generate a record of a new parameterized figure group based on the one or more updated parameters.

9. The system of claim 8, wherein the design server is further configured to modify the one or more parameters associated to at least one figure of the parameterized figure group, according to a command received from the client device via the circuit design interface assigned to the parameterized figure group.

10. The system of claim 9, wherein the design server is further configured to update contents of the at least one figure of the parameterized figure group according to the modified one or more parameters associated to the at least one figure of the parameterized figure group.

11. The system of claim 9, wherein the design server is further configured to generate the new parameterized figure group according to the modified one or more parameters associated to the at least one figure of the parameterized figure group.

12. The system of claim 8, wherein the figure group comprises one or more figures having geometric shapes, and wherein a geometric shape of a figure of the figure group is selected from a group consisting of: rectangle, polygon, line, path, arc, ellipse, dot, and donut.

13. A computer-implemented method comprising:
generating, by a computer, a figure of a first parameterized figure group according to one or more inputs received via a graphical user interface (GUI) configured to display one or more design elements of a circuit design, the one or more design elements including the first parameterized figure group, and the GUI displaying the figure of the first parameterized figure group based upon one or more attributes of the first parameterized figure group stored in a database;
generating, by the computer, a template of the first parameterized figure group in the database, the template comprising one or more parameters corresponding to the one or more attributes of the first parameterized figure group;
updating, by the computer, the one or more parameters of a record of the first parameterized figure group associated with the figure of the first parameterized figure group according to one or more inputs received via the GUI;
generating, by the computer, in the database a record of a second figure having the one or more attributes corresponding to the one or more parameters of the template, and generating a figure of a second parameterized figure group on the GUI, wherein the second parameterized figure group comprises a fluid shape or a fluid shape that is characterized by being capable of being visually edited;
updating, by the computer, the one or more parameters of the template in the database in accordance with one or more inputs received via the GUI;
updating, by the computer, the one or more attributes of the first parameterized figure group and the second parameterized figure group, upon updating the one or more parameters of the template; and
updating, by the computer, the figure of the first parameterized figure group and the figure of the second parameterized figure group displayed on the GUI, in accordance with the attributes of the first parameterized figure group and the attributes of the second parameterized figure group.

14. The computer-implemented method of claim 13, wherein the updating of the figure of at least one of the first parameterized figure group and the second first parameterized figure group changes a size, an orientation, a shape, and a geometric dimension of the corresponding figure displayed on the GUI.

15. The computer-implemented method of claim 13, wherein the updating the one or more parameters comprises stretching one or more portions of shapes, updating, compacting, chopping, merging, polygon conversion, keep-out generation or tunneling, keep-out deletion or healing, or abutment functionality.

16. The computer-implemented method of claim 13, further comprising:
identifying, by the computer, one or more parameters affected by editing the figure of the first parameterized figure group; and
identifying, by the computer, a list of shapes and parameters for a plurality of figures affected by the editing, wherein the computer executes an editing function to implement the editing of the figures on the GUI.

17. The computer-implemented method of claim 16, wherein the editing function identifies a type of editing being implemented, identifies one or more parameters affected by the editing, and performs functionality to changes the one or more parameters upon graphical edits by an editor.

18. The computer-implemented method of claim 13, wherein the generating of the second parameterized figure group further comprises:
specifying, by the computer, an identity of an implementation function for the second parameterized figure group; and
transmitting, by the computer, in a record of the second parameterized figure group information about the second parameterized figure group to an electronic design tool executed by a second computer.

19. The computer-implemented method of claim 13, further comprising:
tagging a figure in a parameterized figure group with a tag; and
identifying the figure of the parameterized figure group to be edited based at least in part upon the tag.

* * * * *